United States Patent [19]
Lawrence

[11] Patent Number: 4,878,222
[45] Date of Patent: Oct. 31, 1989

[54] DIODE LASER WITH IMPROVED MEANS FOR ELECTRICALLY MODULATING THE EMITTED LIGHT BEAM INTENSITY INCLUDING TURN-ON AND TURN-OFF AND ELECTRICALLY CONTROLLING THE POSITION OF THE EMITTED LASER BEAM SPOT

[75] Inventor: David J. Lawrence, Rochester, N.Y.

[73] Assignee: Eastman Kodak Company, Rochester, N.Y.

[21] Appl. No.: 228,430

[22] Filed: Aug. 5, 1988

[51] Int. Cl.⁴ ................................................ H01S 3/19
[52] U.S. Cl. .......................................... 372/48; 372/45; 372/50; 357/17; 357/19; 357/22
[58] Field of Search .......................... 372/48, 50, 43, 44, 372/45, 46; 357/17, 19, 22, 41

[56] References Cited

U.S. PATENT DOCUMENTS

| | | | |
|---|---|---|---|
| 3,305,685 | 2/1967 | Wang | 250/199 |
| 3,340,479 | 9/1967 | Ashkin | 331/94.5 |
| 3,402,366 | 9/1968 | Williams et al. | 331/94.5 |
| 3,436,679 | 4/1969 | Fenner | 331/94.5 |
| 3,508,111 | 4/1970 | Davidson et al. | 315/169 |
| 3,517,337 | 6/1970 | Shah | 332/7.51 |
| 3,518,574 | 6/1970 | Rutz | 332/7.51 |
| 3,702,975 | 11/1972 | Miller | 331/94.5 |
| 3,768,037 | 10/1973 | Migitaka et al. | 332/7.51 |
| 3,959,808 | 5/1976 | King | 357/18 |
| 4,152,711 | 5/1079 | Nakata | 357/17 |
| 4,212,020 | 7/1980 | Yariv et al. | 357/17 |
| 4,216,485 | 8/1980 | Page | 357/19 |
| 4,296,386 | 10/1981 | Tijburg et al. | 331/94.5 |
| 4,408,330 | 10/1983 | An | 372/45 |
| 4,430,741 | 2/1984 | Fukuzawa et al. | 372/46 |
| 4,475,200 | 10/1984 | Lee | 372/46 |
| 4,503,540 | 3/1985 | Nakashima et al. | 372/47 |
| 4,534,033 | 8/1985 | Nishizawa et al. | 372/50 |
| 4,675,518 | 6/1987 | Oimura et al. | 250/205 |
| 4,700,353 | 10/1987 | Van Gieson et al. | 372/26 |
| 4,719,636 | 1/1988 | Yamaguchi | 372/50 |

FOREIGN PATENT DOCUMENTS 0004192  1/1984  Japan ................................. 372/48

Primary Examiner—William L. Sikes
Assistant Examiner—Georgia Y. Epps
Attorney, Agent, or Firm—Carl O. Thomas

[57] ABSTRACT

A family of semiconductor diode lasers is made available whose emitted laser light beam intensity can be electrically modulated with low voltage, low current modulating control bias signals. By appropriate design of the diode laser devices in accordance with the invention and provision of means for adjusting the relative values of the applied modulating control bias signals, the improved diode lasers can be switched on and off electrically in addition to modulation of the emitted output laser light beam intensity. Further, the physical position of the emitted laser light beam spot along the laser facet readily can be moved by the same electrically operable control means so as to provide modulation, turn-on and turn-off and small lateral movement as well as scanning of the laser light beam in a single heterostructural diode laser device.

30 Claims, 5 Drawing Sheets

DIODE LASER WITH IMPROVED MEANS FOR ELECTRICALLY MODULATING THE EMITTED LIGHT BEAM INTENSITY INCLUDING TURN-ON AND TURN-OFF AND ELECTRICALLY CONTROLLING THE POSITION OF THE EMITTED LASER BEAM SPOT

TECHNICAL FIELD

This invention relates to the field of semiconductor diode lasers.

More particularly, the invention relates to improved semiconductor diode lasers whose emitted laser light beam intensity can be electrically modulated with low voltage, low current modulating control bias signals. By appropriate design of the diode laser devices and adjustment of the relative values of the applied modulating control bias signals, the improved diode lasers can be switched on and off electrically in addition to modulation of the emitted output laser light beam intensity, and the physical position of the emitted laser light beam spot along the laser facet readily can be moved back and forth to achieve scanning of the emitted light beam with the same electrically operable control means.

BACKGROUND PRIOR ART

For a good background description of the construction and techniques for fabricating semiconductor light-emitting diode lasers, reference is made to the textbook by A. A. Bergh and P. J. Dean entitled "Light-Emitting Diodes"—published by Clarendon Press, Oxford, England 1976 and "Heterostructure Lasers" by H. C. Casey and M. B. Panish—published by Academic Press, 1978.

Semiconductor diode lasers conventionally are modulated by varying the drive current supplied across the p-n junction of the diode laser within which an active layer of photoluminescent light producing semiconductor composition is disposed. Modulation of the emitted laser light beam intensity in this known manner can and does require controlling substantial magnitude drive currents, particularly for high-power rated devices. In addition, there is often a need to design special holding structures for diode lasers to assure that there is proper alignment between the emitted laser light beam spot on the diode laser facet where the emitted laser beam is coupled to a receptor body such as a fiber optic coupling element in an optical communication system, or where the diode is used in an array for display purposes or in a printer. To alleviate some of the stringent physical positioning requirements imposed on such holding structures, it is desirable that some simple, low signal level electrically operable means be provided for physically moving or positioning the emitted light beam spot along the laser facet. It is particularly desirable to provide a semiconductor diode laser in which the above briefly-discussed features and characteristics are embodied in a single device.

Low power signal level, gate controlled, fast modulation of the emitted light beam intensity of a semiconductor diode laser has been disclosed in a number of prior art U.S. patents, included amongst which are the following: U.S. Pat. No. 4,430,741 issued February 7, 1984 for a "Semiconductor Laser Device"—Tadashi Fukuzawa, Michiharu Nakamura and Susumu Takahashi, inventors; U.S. Pat. No. 4,700,353 issued October 13, 1987 for "Active Modulation of Quantum Well Lasers by Energy Shifts in Gain Spectra with Applied Electric Field"—Edward Van Gieson, Gary W. Wicks, Eric Elias and Lester F. Eastman, inventors; U.S. Pat. No. 4,534,033 issued August 6, 1985 for a "Three Terminal Semiconductor Laser"—Jun-ichi Nishizawa, Tadahiro Ohmi, Masakazu Morishita, inventors; U.S. Pat. No. 3,959,808 issued May 25, 1976 for a "Variable Stripe Width Semiconductor Laser"—Frederick David King, inventor; and U.S. Pat. No. 4,152,711 issued May 1, 1979 for a "Semiconductor Controlled Luminescent Device"—Josuke Nakata, inventor.

Electrically controlled scanning of the position and direction of the emitted laser light beam from semiconductor diode lasers is disclosed in U.S. Pat. No. 4,296,386 issued October 20, 1981 for a "Semiconductor Injection Laser Having a Movable Laser Beam"—Rudolf P. Tijourg, Peter J. de Waard and Teunis van Dongen, inventors, and U.S. Pat. No. 4,475,200 issued October 2, 1984 for a "Semiconductor Laser Beam Scanner"—Chien-Ping Lee, inventor.

None of the above-listed prior art U.S. patents disclose or make available to the industry a single semiconductor diode laser device which is capable both of low signal level, electrical controlled modulation of the emitted laser light beam intensity including turn-on and turn-off of the beam, and physical movement to provide scanning of the position of the emitted laser light beam spot along the facet of the laser.

SUMMARY OF INVENTION

It is therefore a primary object of the present invention to provide a semiconductor diode laser device whose emitted laser light beam intensity can be electrically modulated with a low voltage, low current gate control signal which also can be used to turn-on and turn-off the laser light beam, and to control the physical positioning of the emitted laser light beam spot along the facet of the laser including scanning, with all of these capabilities being embodied in a single diode laser device.

In one aspect, this invention is directed to a heterostructure, combined semiconductor diode laser and junction field effect transistor device having a centrally located conduction path from a central exposed contact on its top surface through a centrally located semiconductor active laser region disposed between upper and lower opposite conductivity type cladding regions formed over a semiconductor channeled substrate of the same conductivity type as the lower cladding region and having at least one laser stripe channel filled with a semiconductor composition of the same conductivity type as the lower cladding region and formed in the top surface of the substrate which supports the vertically arrayed cladding and active regions and an exposed contact on its underside; characterized in that:

first and second semiconductor barrier regions of opposite conductivity type from the substrate are interposed on opposite sides of the laser stripe channel between the lower cladding region and the substrate and electrically isolated one from the other; and first and second exposed contacts are formed on the top surfaces of the respective first and second barrier regions for application of independent bias potentials to the respective barrier regions whereby depletion regions of independently controlled extent are established by the barrier regions and in the laser stripe channel for controlling the magnitude of the current through the central conduction path to thereby modulate the intensity of a laser light beam produced in the active region.

By application of appropriate value and polarity bias potentials to the central contact, first and second exposed gate control contacts and the substrate, current conduction through the central conduction path can be modulated as well as pinched off so as to turn-on and turn-off the emission of light from the device and to control the intensity of the emitted light beam. Further, by the application of appropriate polarity low voltage and current control electric bias potentials to the first and second exposed contacts relative to the substrate bias, the position of the central current conduction path through the device can be moved by variation of the relative extent of the depletion regions formed in the central conduction channel adjacent to the respective barrier regions whereby the physical position of the emitted light beam waist within the junction plane of the active region of the device can be moved to thereby result in lateral movement in a desired direction of the emitted laser beam output light spot along the laser facet. By appropriate design of the barrier regions, lateral movement can be extended to achieve scanning of the laser light beam.

BRIEF DESCRIPTION OF THE DRAWINGS

These and other objects, features and many of the attendant advantages of this invention will be appreciated more readily as the same becomes better understood from a reading of the following detailed description, when considered in connection with the accompanying drawings, wherein like parts in each of the several figures are identified by the same reference characters and wherein.

BEST MODE OF PRACTICING INVENTION

Figure 1:
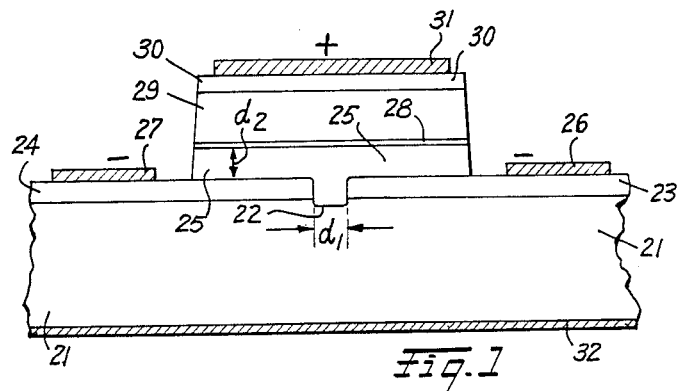
FIG. 1 of the drawings is a longitudinal, vertical sectional view of a channeled substrate, heterostructure combined semiconductor diode laser and junction field effect transistor device constructed according to the invention.

FIG. 1 is a vertical sectional view of one embodiment of a channeled substrate, heterostructure, combined semiconductor diode laser and junction field effect transistor device constructed according to the invention. In the following description if a region or layer is only moderately doped, it will be identified as either a negative conductivity type with an n or a positive conductivity type with a p. It it is lightly doped it will noted with an n− or p− and a heavily doped layer will be noted p+ or n+.

In FIG. 1 the structure is based upon an n-type conductivity gallium arsenide substrate 21 of n-GaAs having at least one laser stripe channel 22 of width $d_1$ formed in its top surface. A first semiconductor barrier region shown at 23 and a second semiconductor barrier region 24 are formed on the top surface of the substrate 21 on each side of the laser stripe channel 22 so as to be electrically isolated one from the other by the stripe channel 22. In FIG. 1 the barrier regions 23 and 24 are of the same conductivity type a semiconductor material but are opposite in conductivity type to that of the substrate 21 and are comprised by expitaxially grown single layers of p+-GaAs. A first or lower cladding region 25 of single layer n-aluminum gallium arsenide (n-$Al_yGa_{1-y}As$) is epitaxially grown over the adjacent inner edges of the first and second barrier layers 23 and 24 and extends down into and fills the laser stripe channel 22. This first (lower) cladding layer is provided with a depth $d_2$ in the areas of the layer which overlie the inner adjacent edges of the barrier layers 23 and 24, but does not extend to or electrically contact a set of separate, spaced-apart, gate control ohmic contacts 26 and 27 which are formed on the top, outer surfaces of the respective barrier layers 23 and 24. Thus the gate control contacts 26 and 27 are electrically isolated one from the other and from the first (lower) cladding region 25.

A semiconductor active lasing composition layer 28 of $Al_xGa_{1-x}As$ is epitaxially grown over the first cladding layer 25. A second or upper cladding region of opposite conductivity type to that of the first cladding region 25 is formed by a single layer 29 epitaxially grown over the active layer 28. The second (upper)

cladding layer 29 is comprised of epitaxially grown p-$Al_yGa_{1-y}As$. A contact semiconductor region comprised by layer 30 of p+-GaAs is epitaxially grown over the second (upper) cladding layer 29 and a third ohmic contact 31 is formed on the contact region 30 and serves as the positive current terminal of the diode laser device. A fourth backside ohmic contact 32 is formed on the under surface of the substrate 21 and serves as the negative current terminal of the diode laser. For a more detailed description of the techniques used in forming the different layers, regions and ohmic contacts on the beginning substrate 21, reference is made to the above-noted textbooks by Bergh and Dean entitled "Light-Emitting Diodes" and Casey and Panish entitled "Heterostructure Lasers".

The drawing of the embodiment of the invention shown in FIG. 1, as well as those in the further figures to be described hereafter, is a longitudinal vertical sectional view taken along a plane parallel to the laser facet (not shown) that constitute the Fabry-Perot light resonator of the semiconductor laser device. Laser light emitted by the device normally would emerge along a path coincident with the center of the active region 28 and at right angles to the plane of the paper and toward the viewer as viewed in FIG. 1.

Figure 2:
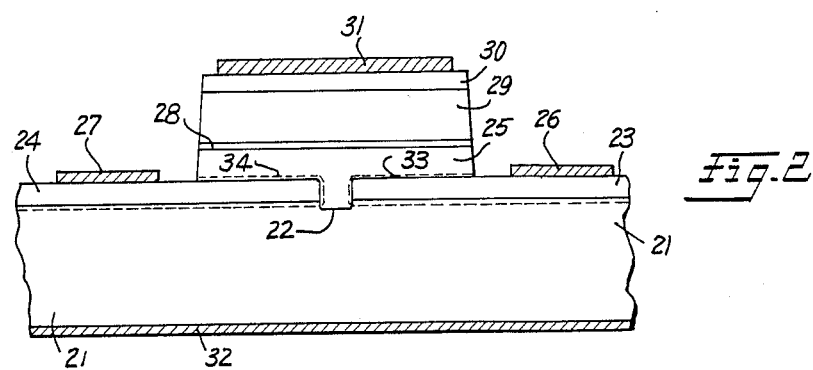
FIG. 2 is a repeat of FIG. 1, except that the edge of the depletion regions in the n-type material surrounding the barrier regions of the device are shown for the condition where there are zero or nearly zero gate control biases applied to the exposed ohmic gate contacts formed on the barrier layers relative to the substrate.

The device resembles a channeled substrate planar laser of conventional construction, except that respective p+-GaAs barrier layers 23 and 24 have been provided on each side of the laser stripe channel 22 and are provided with separate, accessible ohmic gate contacts 26 and 27, respectively. In operation, the conventional central laser current control contact 31 is biased positive with respect to the n-GaAs substrate 21 until the laser current exceeds the threshold current, and the device begins to emit laser light as described above. For the purpose of the following description, it is assumed that the contacts 26 and 27 are interconnected so that the two contacts are maintained at the same bias potential. If the contacts 26 and 27 are biased negative with respect to substrate 21, then as 26 and 27 are made more negative than substrate 21, depletion regions around the barrier layers 23 and 24 expand into substrate 21 and into the first (lower) cladding layer 25. The depletion regions are shown at 33 for the barrier layer 23 and at 34 for the barrier layer 24 in Fig. 2 of the drawings. Fig. 2 is drawn for the case where there is zero or nearly zero applied control bias signals supplied to the respective contacts 26 and 27 with respect to the substrate 21.

Figure 3:
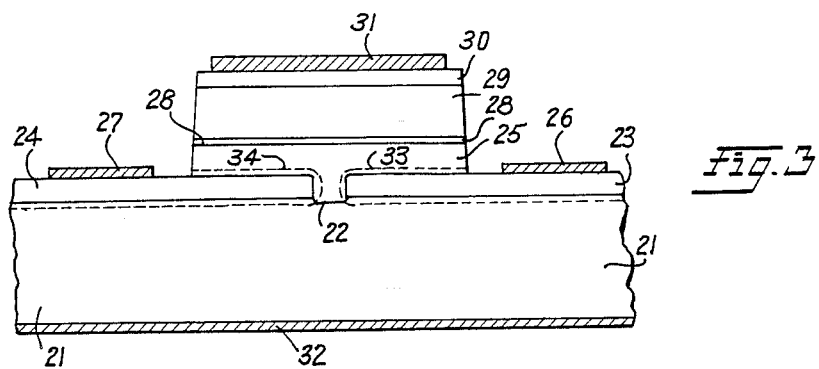
FIG. 3 shows the depletion region formed in the device with the gate contacts on the barrier layers comprising the barrier regions both biased negative with respect to the substrate.
Figure 4:
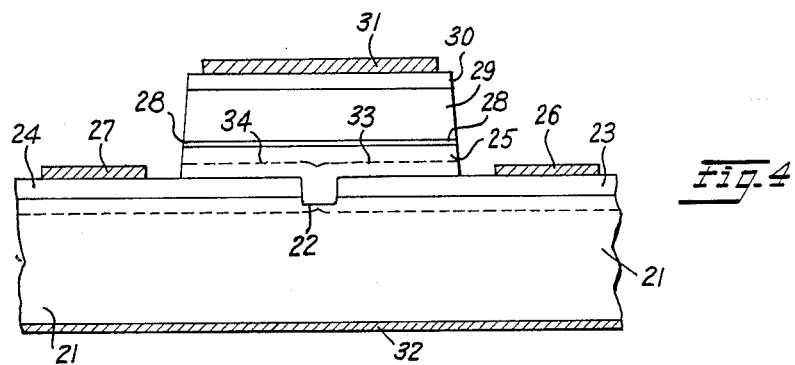
FIG. 4 is the same as FIG. 1 but shows the conditions when a large negative bias is applied to both exposed gate contacts on the barrier layers relative to the substrate.

FIG. 3 of the drawings shows the depletion regions 33 and 34 under conditions where the contacts 26 and 27 are both biased more negatively with respect to the substrate 21 than in FIG. 2. As shown in FIG. 3, the width of the laser stripe channel 22 through which the vertical electron current must flow from the substrate 21 to the active layer 28 has been constricted by the expansion of the depletion regions 33 and 34 into the channel. This reduces the current flow through the laser and hence reduces the intensity of the laser output light beam. FIG. 4 of the drawings illustrates what happens to the depletion regions 33 and 34 under conditions where a larger negative bias than used in FIG. 3, is applied to both contacts 26 and 27 with respect to the substrate 21. Under these conditions, the depletion regions 33 and 34 extend so far into the channel that its width 22 is pinched off. As a result, electron flow from the substrate 21 to the active region 28 ceases and no further laser light is emitted. For this type of operation, the n-type conductivity cladding region 25 must be lightly doped enough and the width of the laser stripe channel 22 must be narrow enough so that the depletion regions 33 and 34 can extend through an appreciable fraction of the width of the channel. By modulating the value of the control bias voltage applied to the ohmic contacts 26 and 27 relative to the substrate 21 voltage supplied through the underside contact 32, the light intensity of the output laser light beam can be correspondingly modulated with a low value voltage and current modulating control signal applied to the gate contacts 26 and 27. The modulating signal is a voltage and the current can be very small. As noted with respect to FIG. 4, this modulating signal also can be used to turn-on and turn-off the diode laser device.

If desired, the diode laser device structure of FIG. 1 can be operated in a different manner if the relative dimension and doping levels of the various layers are appropriately designed (e.g. if the dimension $d_1$ is substantially greater than the dimension $d_2$ shown in FIG. 1 whereby $d_2 << d_1$). With a structure designed in this manner, the depletion regions 33 and 34 surrounding the barrier layers 23 and 24 can be made to extend up to and reach the $Al_xGa_{1-x}As$ active layer 28 of the laser. Upon this occurrence, holes will be drawn out of the active layer and into the barrier layers 23 and 24 so that the effect can be used to modulate or even to quench the laser light output similar to the channel squeezing technique described above. Under these conditions, a substantial current will flow out of the ohmic contacts 26 and 27. Also, where $d_2 << d_1$ and the doping levels are appropriate, the depletion layers 33 and 34 will reach the active layer 28 before the channel width 22 is narrowed significantly by the depletion regions.

Using the diode laser structure designed principally for channel narrowing as described above with relation to FIGS. 3 and 4, it is possible to electrically control the position in relation to the laser facet of the output laser beam waist in the junction plane since the width of the optical mode is electrically adjustable with this device. Under these conditions, the diode laser will be driven with a current source (as opposed to a voltage source), feedback is used to maintain constant output power, and reverse bias is applied to the gate control ohmic contacts 26 and 27 to adjust the beam waist position in the junction plane of the diode.

Figure 5:
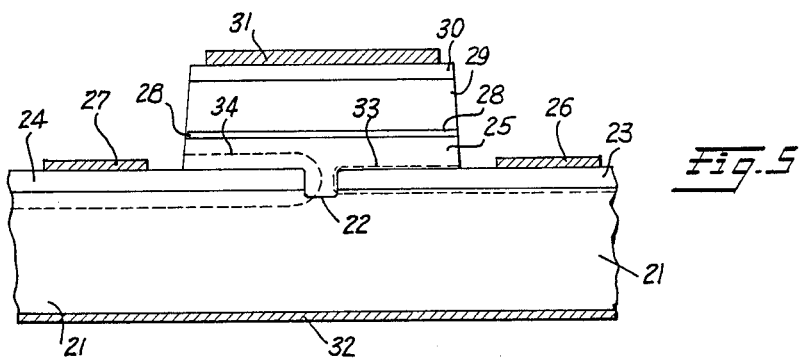
FIG. 5 is the same as FIG. 1 but shows what happens when unequal bias potentials are applied to the exposed gate contacts on the barrier regions under conditions where a large negative bias relative to the substrate is applied to the left-hand gate contact as viewed by the reader while no bias is applied to right-hand contact.
Figure 6:
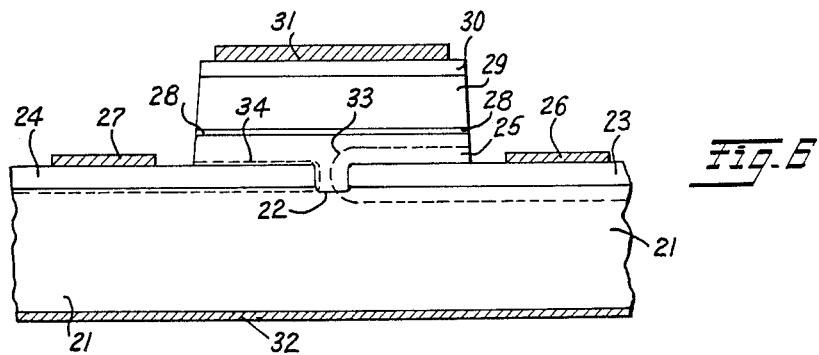
FIG. 6 is similar to FIG. 5 except that the gate contact to which a large negative bias is applied has been reversed with respect to the condition shown in FIG. 5.

In the preceding description, it was assumed that the ohmic contacts 26 and 27 were tied together and biased to the same voltage level. This is not a requirement for the two gate contacts can be operated independently of each other. For example, ohmic contact 26 could be grounded and contact 27 could be biased negative with respect to the substrate 21. Operation in this manner would tend to "push" the carrier distribution in the active layer to the right as illustrated in FIG. 5 of the drawings. Conversely, if ohmic contact 27 is grounded and contact 26 is biased negative with respect to substrate 21, the carrier distribution in the active layer would be pushed to the left as shown in FIG. 6 of the drawings. If the bias voltages applied to contacts 26 and 27 are at the same potential, carrier distribution would be symmetric as illustrated in FIG. 3. Thus, it is seen that the carrier distribution in the active layer can be moved from side to side by appropriate variation of the bias potentials applied to the respective ohmic contacts 26 and 27. The optical gain profile follows this carrier distribution, thus it is possible to electrically move the output laser beam spot from side to side on the laser facet using the two exposed gate control contacts in the above briefly described manner. Such movement can greatly simplify alignment of the output laser beam spot with fiber optic coupling devices, where used in displays, and where used with optical printers.

Figure 7:
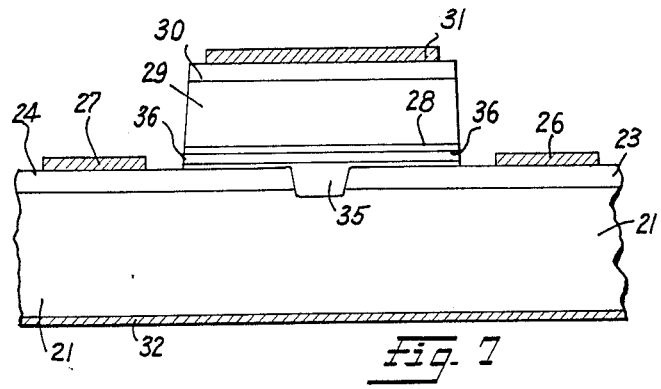
FIG. 7 is a vertical sectional view of a different embodiment of the invention wherein the lower n-type cladding region is comprised of two separate layers epitaxially formed one over the other on the top surfaces of the barrier layers of the device.

FIG. 7 of the drawings shows a different embodiment of the invention which is used to assure that the channel-narrowing mechanism described with relation to FIGS. 1-4 dominates during operation of the laser diode. That is to say, in the FIG. 7 embodiment the depletion regions 33 and 34 are prevented from extending through the first (lower) cladding region 25 and reaching the active layer 28. For this purpose, the first (lower) cladding region 25 is divided into two superimposed cladding layers 35 and 36. The first cladding layer 35 is comprised by lightly doped $n^-$-$Al_wGa_{1-w}As$ epitaxially grown over the exposed inner, adjacent edges of the respective barrier layers 23 and 24 and extends down into and fills the laser stripe channel with a lightly doped semiconductor composition. A second more heavily doped cladding layer 36 of $n$-$Al_yGa_{1-y}As$ is epitaxially grown over the first cladding layer 35 and is interposed between first cladding layer 35 and the active layer 28. The two layers 35 and 36 thus make up the first (lower) cladding region. By this means, the depletion regions 33 and 34 induced by the barrier layers 23 and 24 as shown in FIGS. 2-4 as a result of the gate bias potentials applied to the ohmic contacts 26 and 27, are made to extend into first cladding layer 35 and (if desired) across the width of the laser stripe channel 22 but are prevented by the more heavily doped second cladding layer 36 from reaching the active layer 28. The AlAs fractions w and y can be made to be equal and the combined thicknesses of the first $n^-$-$Al_wGa_{1-w}As$ cladding layer 35 outside of the laser stripe channel and the second $n$-$Al_yGa_{1-y}As$ cladding layer 36 can be small enough that the device provides the same lateral wave guiding as a channeled substrate planar laser and operates in a fundamental lateral mode.

Figure 8:
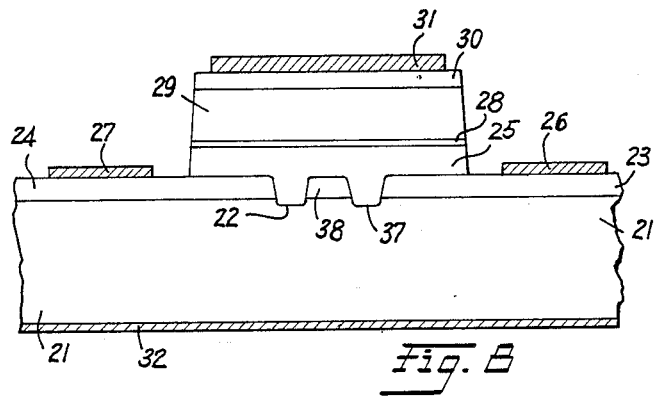
FIG. 8 illustrates an embodiment of the invention wherein multiple stripe channels are formed in the upper surface of the planar substrate of the diode laser device to extend the scanning capability of the device.

FIG. 8 shows an embodiment of the invention which is similar in many respects to that shown in FIG. 1 but which has been modified to provide for greater lateral scanning of the output laser beam light spot pursuant to the disclosure depicted in FIGS. 5 and 6 of the drawings. For this purpose, the beginning substrate 21 is provided with two or more adjacent laser stripes 22 and 37 formed in the top surface of the substrate 21 and in the barrier layers 23 and 24. An intermediate barrier layer island 38 is thus formed during the process, and is comprised of $p^+$-GaAs similar to the barrier layers 23 and 24. The laser stripe channels are filled with the same semiconductor composition as the first (lower) cladding region 25 so that narrowing of the current conduction path through the laser stripe 22 and 37 is entirely similar to that described with relation to FIGS. 2-4 of the drawings. A wider scanning angle can be achieved by appropriately varying the bias potentials supplied to gate contacts 26 and 27 pursuant to the techniques described with relation to FIGS. 5 and 6 of the drawings and those illustrated and described with relation to FIGS. 2-4.

Figure 9:
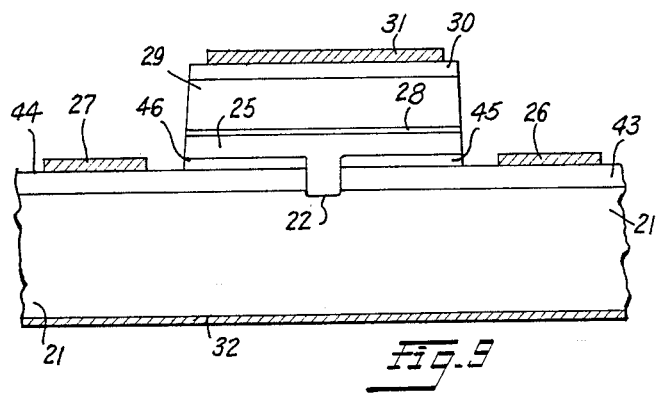
FIG. 9 is a vertical sectional view of still another embodiment of the invention wherein the lower n-type cladding region is comprised of two separate epitaxially formed layers.

FIG. 9 illustrates still another embodiment of diode laser device constructed according to the invention. In FIG. 9 two barrier layers 43 and 44 on either side of the laser stripe channel 22 are comprised by single layers of $p^+$-$Al_uGa_{1-u}As$ epitaxially grown on the upper surface of an n-GaAs substrate 21 and ohmic contacts 26 and 27 are formed on respective outwardly extending exposed shoulders of the barrier layers 43 and 44. n-GaAs layers 45 and 46 are introduced between the barrier layers 43 and 44, respectively, and the $n$-$Al_yGa_{1-y}As$ first (lower) cladding layer 25. In other respects, the device of FIG. 9 is similar to FIG. 1 in that the cladding layer 25 of $n$-$Al_yGa_{1-y}As$ bridges between the two upper layers 45 and 46 of n-GaAs and extends down into and fills the laser stripe channel 22 between the barrier layers 43 and 44. The barrier layers 43 and 44 consist of $p^+$-$Al_uGa_{1-u}As$ with the AlAs fraction u greater than the AlAs fraction x in the active layer 28. Because of this feature, light generated in the active layer 28 of the laser device is not absorbed in the barrier layers and does not perturb device operation. The n-GaAs layers 45 and 46 introduced between the barrier layers 43 and 44 and the lower cladding layer 25, are doped heavily enough that the depletion regions extending from both barrier layers 43 and 44 readily can pinch off the vertical current channel through the laser stripe channel 22 in the manner shown in FIG. 4 before extending upwardly all the way through the n-GaAs layers 45 and 46 and into the lower cladding layer 25. This feature allows the active layer 28 to be close to the n-GaAs layers 45 and 46 thereby providing an improved mode stability in operation, as is achieved in conventional channeled substrate planar structures.

Figure 10:
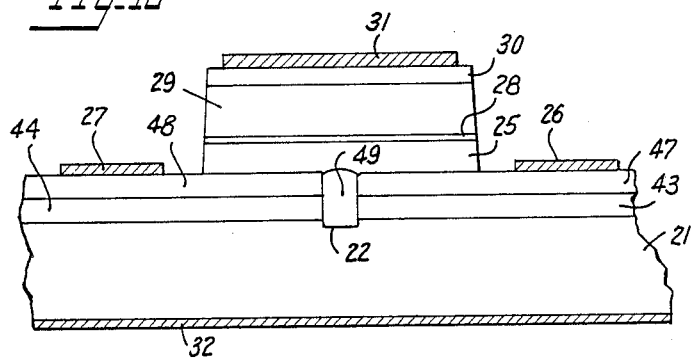
FIG. 10 illustrates the preferred embodiment of the invention wherein the barrier regions of the device are comprised by two separate epitaxially formed barrier layers one over the other with the laser stripe channel being filled with a lightly doped semiconductor composition that is of the same conductivity type and semiconductor material composition as the lower cladding region but which is lightly doped.

FIG. 10 illustrates the preferred embodiment of the improved laser diode devices herein described. Again, as in the FIG. 9 species of the invention, there are two $p^+$-type barrier layers 43 and 44 of $p^+$-$Al_uGa_{1-u}As$ which function in the same manner described with relation to FIG. 9. In FIG. 10, however, the GaAs layers are introduced into the barrier regions as p-GaAs layers 47 and 48 epitaxially grown on the $p^+$-$Al_uGa_{1-u}As$ barrier layers 43 and 44, respectively. Ohmic contacts 26 and 27 are formed over the upper barrier layers 47 and 48, respectively, and a lightly doped semiconductor composition 49 of $n^-$-$Al_wGa_{1-w}As$ is employed to fill the laser stripe channel 22 and extends between substrate 21 up to and engages the lower surface of the first (lower) cladding layer 25 as well as the side edges of both lower and upper barrier layers 43, 44 and 47, 48. The AlAs fraction w in the stripe composition 49 can be equal to the same fraction y used in the cladding layers 25 and 29. Because the material 49 used to fill the stripe is lightly doped, the channel readily can be pinched off in the manner described with relation to FIG. 4 of the drawings thereby enhancing fast modulation and turn-on and turn-off operation of the diode laser using only low power level control bias signals applied to the ohmic contacts 26 and 27. In this structure the n cladding layers 25 and 29, particularly 25, can be more heavily doped so that the depletion regions developed by the barrier layers will not extend all the way upward to contact the active layer 28.

Figure 11:
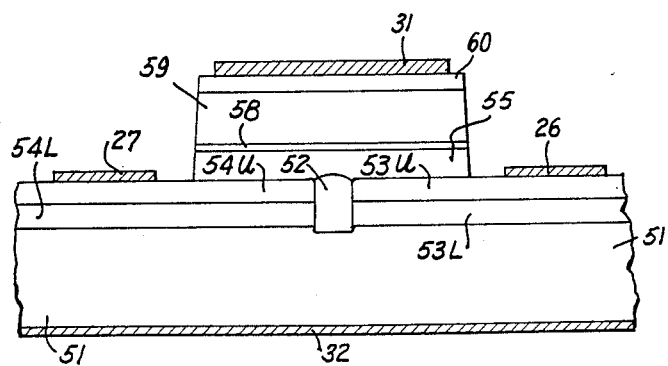
FIG. 11 is an example of the present invention fabricated from an InGaAsP material system different from AlGaAs system employed with earlier illustrated embodiments of the invention.
Figure 12:
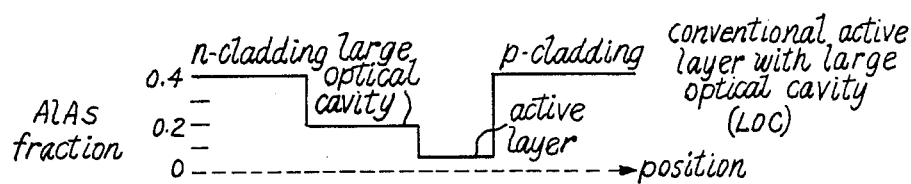
Figure 12:
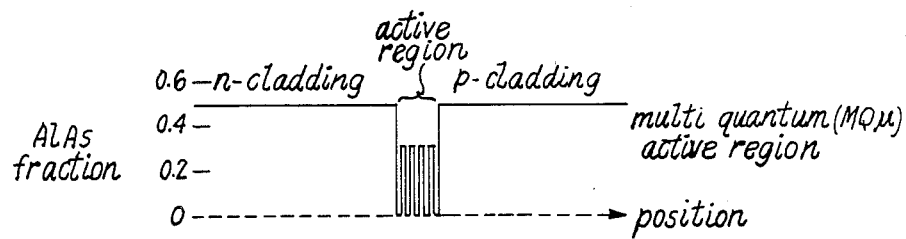
Figure 12:
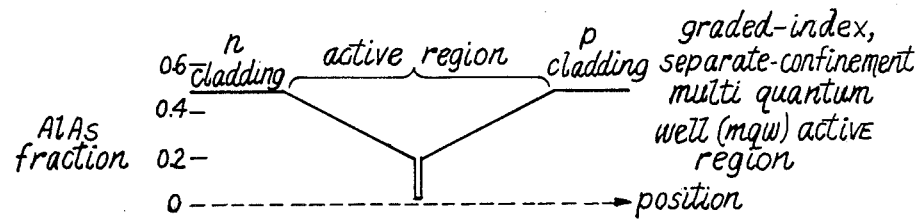

There are numerous other technical approaches that can be used in making diode lasers having the features discussed in the preceding description. If desired, the diode laser structures could be totally inverted by changing all of the n-type material to p-type material and conversely. Further, the above description has mentioned only the use of the $Al_xGa_{1-x}As$ semiconductor material system in the structures. However, these structures could be fabricated from other material systems known to be suitable for use in diode lasers. FIG. 11 of the drawings is a longitudinal, vertical section view of an embodiment of the invention fabricated from a different semiconductor materials system, namely InGaAsP. The device shown in FIG. 11 is fabricated on an n-InP substrate 51 having a laser stripe 52 formed in its upper surface. Barrier regions comprised by respective lower barrier layers 53L and 54L formed on substrate 51 on either side of the laser stripe 52 have superposed thereon second (upper) barrier layers 53U and 54U epitaxially grown in sequence on the exposed upper surface of substrate 51 on each side of the laser stripe 52 as shown in FIG. 11. The lower barrier layers 53L and 54L are comprised by p+-InP and the upper barrier layers 53U and 54U are comprised by p-InGaAsP, $\lambda_g = 1.35$ um. A first (lower) cladding region 55 is formed over and bridges across the inner adjacent upper surfaces of the top barrier layers 53U and 54U and is comprised by epitaxially grown n-InP. A lightly doped filling composition 52 of n−-InP fills the laser strips 52 and makes contact with the inner adjacent ends of barrier layers 53U, 53L, 54U and 54L as well as the lower surface of the n-InP first cladding layer 55. An active layer comprised of InGaAsP, $\lambda_g = 1.3$ um is epitaxially grown over the first (lower) cladding layer 55. A second (upper) cladding layer of p-InP is formed over the active layer, and a contact region 60 is formed by a layer p+-InGaAsP, $\lambda_g = 1.3$ um. Ohmic contacts 26 and 27 are formed over the exposed upper side edges of the upper barrier layers 53U and 54U. Central ohmic contact 31 is formed over the contact region 60 and backside contact 32 is formed over the underside of the substrate 51. In operation the embodiment of the invention shown in FIG. 11 functions similarly to that described with relation to FIG. 10 above.

Figure 12A:
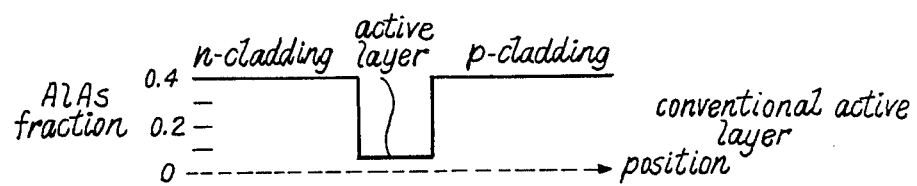
FIGS. 12A–12D of the drawings illustrate specific examples of various types of laser active region designs that can be incorporated into the various heterostructure laser diode devices shown in FIG. 1–11.

FIGS. 12A-12D show different examples of various types of known laser active region designs that can be incorporated into and used in the laser diode devices constructed according to the present invention. The graphs shown in FIGS. 12A-12D illustrate the AlAs fractions in the compositions of the different active regions depicted, plotted as a function of vertical position through the active region between the lower n cladding region and the upper p cladding region. FIG. 12A shows a conventional active layer design such as that depicted in FIGS. 1-11 of the drawings. FIG. 12B shows the parameters of a conventional active layer design provided with a large optical cavity (LOC) between the active layer and the n cladding region. The LOC instead could be introduced between the active layer and the p cladding region. If desired, the active layer could be made thinner and the LOCs introduced on both sides of the active layer, separating it from the n and p cladding regions to form what is called a separate-confinement heterostructure active region. FIG. 12C of the drawings shows a multiple quantum well (MQW) active region with five pure GaAs quantum wells in the example shown. FIG. 12D illustrates a graded-index, separate-confinement heterostructure (GRIN-SCH) active region design having a small amount of AlAs in the central quantum well. Each of these known active region designs could be used in the respective improved laser diode device structures shown in FIGS. 1-11 of the drawings depending upon a specific intended application for the diode laser device.

INDUSTRIAL APPLICABILITY

The invention provides a family of semiconductor diode lasers whose emitted laser light beam intensity can be electrically modulated with low voltage, low current modulating control bias signals. By appropriate design of the diode laser devices and including means for adjustment of the relative values of the applied modulating control bias signals, the diode lasers can be switched on and off electrically in addition to modulation of the emitted output laser light beam intensity. Further, the physical position of the emitted laser light beam spot along the laser facet readily can be moved to provide scanning of the laser light beam by the same electrically operable control means using relatively low signal level control bias voltages and currents.

Having described several embodiments of a diode laser with improved means for electrically modulating the emitted light beam intensity including turn-on and turn-off and for electrically controlling the position of the emitted laser light beam spot along the laser facet, in accordance with the invention, it is believed obvious that other modifications and variations of the invention will be suggested to those skilled in the art in the light of the above teachings. It is therefore to be understood that changes may be made in the particular embodiments of the invention described which are within the full intended scope of the invention as defined by the appended claims.

What is claimed is:

1. A heterostructure combined semiconductor diode laser and junction field effect transistor device having a centrally located conduction path from a central exposed contact on its top surface through a centrally located semiconductor active laser region disposed between upper and lower opposite conductivity type cladding regions formed over a semiconductor substrate of the same conductivity type as the lower cladding region and having at least one laser stripe channel filled with a semiconductor composition of the same conductivity type as the lower cladding region and formed in the top surface of the substrate which supports the vertically arrayed cladding and active regions and an exposed contact on its underside; characterized in that:

first and second semiconductor barrier regions of opposite conductivity type from the substrate are interposed on opposite sides of the laser stripe channel between the lower cladding region and the substrate and electrically isolated one from the other;

first and second exposed contacts are formed on the top surfaces of the respective first and second barrier regions;

means for applying independently controlled bias potentials to the respective barrier regions via the first and second barrier layer contacts whereby depletion regions of independently controlled extent are established by the barrier regions in the laser stripe channel for controlling the magnitude of the current through the central conduction path to thereby modulate the intensity of a laser light beam produced in the active region.

2. A semiconductor diode laser device according to claim 1 further comprising means for applying appropriate value and polarity bias potentials to the central and first and second exposed contacts relative to the bias potential applied to the substrate whereby current conduction through the central conduction path can be pinched off as well as modulated and the emission of laser light from the device can be terminated.

3. A semiconductor diode laser device according to claim 1 further comprising means for applying appropriate polarity and relatively small value electrical bias potentials to the first and second exposed contacts whereby the central current conduction path through the device can be moved by variation of the relative extent of the depletion regions formed by the respective barrier regions and the physical position of the emitted light beam waist within the junction plane of the active region can be moved to thereby result in lateral movement in a desired direction of the emitted laser beam output light spot along the laser facet.

4. A semiconductor diode laser device according to claim 2 further including means for applying appropriate polarity and relatively small value electrical bias potentials to the first and second exposed contacts whereby the central current conduction path through the device can be moved by variation of the relative extent of the depletion regions formed by the respective barrier regions and the physical position of the emitted light beam waist within the junction plane of the active region can be moved to thereby result in lateral movement in a desired direction of the emitted laser beam output light spot along the laser facet.

5. A semiconductor diode laser having improved modulation means together with means for electrically adjusting the position of the laser beam output spot along the laser facet and wherein the diode laser comprises a semiconductor substrate having at least one laser stripe channel formed in its top surface, a first cladding semiconductor region of the same conductivity type as the substrate, a semiconductor active lasing region formed over the first cladding semiconductor region, a second semiconductor cladding region of opposite conductivity type to that of the first cladding region formed over the active region, a semiconductor contact region of opposite conductivity type to that of the substrate formed over the second semiconductor cladding region, a third ohmic contact formed on the semiconductor contact region, and a fourth backside ohmic contact formed on the undersurface of the substrate at least below the laser stripe channel; said laser being characterized in that:

first and second semiconductor barrier regions are formed on the top surface of the substrate on each side of the laser stripe channel and electrically isolated one from the other by the laser stripe channel, said barrier regions being of opposite conductivity type from that of the substrate;

first and second ohmic contacts are formed on the respective first and second barrier regions and are spaced apart from the laser stripe channel;

said first cladding region being formed over the inner adjacent surfaces of the respective barrier regions and extending to the laser stripe channel but not extending to or contacting the ohmic contacts on the respective first and second barrier regions so as to be electrically isolated from the contacts; and being further characterized in that means are provided for applying independently controlled bias potentials to the respective barrier regions via the first and second ohmic contacts whereby depletion regions of independently controlled extent are established by the barrier regions in the laser stripe channel for controlling the magnitude of the current through the central conduction path to thereby modulate the intensity of a laser light beam produced in the active region.

6. A semiconductor diode laser according to claim 5 wherein the barrier, cladding and active regions comprise single semiconductor layers epitaxially grown on the substrate in the sequence listed.

7. A semiconductor diode laser according to claim 6 wherein the substrate is n-GaAs, the barrier layers are formed by p+-GaAs, the first cladding layer comprises n-$Al_yGa_{1-y}As$, the active layer comprises $Al_xGa_{1-x}As$, the contact region comprises p+-GaAs and the second cladding layer comprises p-$Al_yGa_{1-y}As$, the first cladding layer is lightly doped and the width $d_1$ of the laser stripe channel is sufficiently narrow to be depleted of carriers upon the maximum amplitude bias potential being applied to either of the barrier layer ohmic contacts.

8. A semiconductor diode laser according to claim 7 wherein the width $d_1$ of the laser stripe channel is substantially greater than the thickness $d_2$ of the first cladding layer ($d_2 << d_1$) whereby the depletion region surrounding the first and second barrier layer is allowed to reach the active layer so as to stop the lasing action upon application of a sufficient bias potential to the contacts on the first and second barrier layers relative to the substrate.

9. A semiconductor diode laser according to claim 5 wherein there are a plurality of parallel, spaced-apart laser stripe channels formed on the top surface of the beginning substrate.

10. A semiconductor diode laser according to claim 5 wherein the barrier, cladding and active regions comprise single semiconductor layers epitaxially grown on the substrate in the sequence listed, and wherein the substrate is n-GaAs, the barrier layers are formed by p+-GaAs, the first cladding layer comprises n-$Al_yGa_{1-y}As$, the active layer comprises $Al_xGa_{1-x}As$, the second cladding layer comprises p-$Al_yGa_{1-y}As$, and the contact region comprises p+-GaAs, the first cladding layer is lightly doped and the width $d_1$ of the laser stripe channel is sufficiently narrow to be depleted of carriers upon the maximum amplitude bias potential being applied to either of the barrier layer ohmic contacts.

11. A semiconductor diode laser according to claim 5 wherein the first cladding region is formed by at least two different semiconductor layers epitaxially grown on the top surface of the barrier regions and the substrate with the remaining regions of the diode laser being formed thereover in the sequence listed in claim 5.

12. A semiconductor diode laser according to claim 11 wherein substrate is n-GaAs, the barrier layers are formed of p+-GaAs, and the cladding layers forming the first cladding region are comprised by a first n-$Al_wGa_{1-w}As$ layer formed over the inner adjacent surfaces of the first and second barrier regions and extending into and filling the laser stripe channel and a second n-$Al_yGa_{1-y}As$ cladding layer interposed between the first n-$Al_wGa_{1-w}As$ layer and the active region and wherein the first n-$Al_wGa_{1-w}As$ layer is lightly doped with the second n-$Al_yGa_{1-y}As$ cladding layer being heavily doped relative to the first cladding layer to assure that the vertical conduction path channel narrowing mechanism dominates during modulation of the diode laser by application of modulating bias potentials to the first and second ohmic contacts formed on the respective first and second barrier regions.

13. A semiconductor diode laser according to claim 11 wherein the substrate is n-GaAs, the first and second barrier regions each comprise respective single layers of p+-$Al_uGa_{1-u}As$ epitaxially grown on each side of the laser stripe channel, the first cladding region is comprised by adjacent layers of epitaxially grown n-GaAs formed on the surface of the respective first and second p+-$Al_uGa_{1-u}As$ barrier layers on opposite sides of but not filling the laser stripe channel and which make up a first cladding layer comprising part of the first cladding region and a second n-$Al_yGa_{1-y}As$ layer formed over the n-GaAs layers and filling the laser stripe channel to complete the first cladding region, the active region is comprised by an epitaxially grown single $Al_xGa_{1-x}As$ layer, the second cladding region is comprised by a single epitaxially grown p-$Al_yGa_{1-y}As$ cladding layer, and the contact region is comprised by a single epitaxially grown layer of p+-GaAs.

14. A semiconductor diode laser according to claim 5 wherein the first and second barrier regions each are formed by at least first and second different semiconductor barrier layers epitaxially grown on the top surface of the substrate on each side of the laser stripe channel so that the combined barrier layers comprising the first barrier region are electrically isolated from the combined barrier layers comprising the second barrier region.

15. A semiconductor diode laser according to claim 14 wherein the first cladding region extends widthwise across the diode structure over the top second barrier layers of the first and second barrier regions but does not extend down into and fill the stripe channel in the substrate and a lightly doped semiconductor composition of the same conductivity type as the substrate and the first cladding region fills the laser stripe.

16. A semiconductor diode laser according to claim 15 wherein the first barrier layers in each of the first and second barrier regions which contact the substrate top surface are comprised of p+-$Al_uGa_{1-u}As$, the second barrier layers are comprised of p-GaAs, the first cladding region comprises n-$Al_yGa_{1-y}As$ and the lightly doped semiconductor composition filling the laser stripe is comprised of n-$Al_wGa_{1-w}As$, the AlAs fraction in the laser stripe channel semiconductor composition is substantially equal to the AlAs fraction in the first cladding region and the first cladding region is heavily doped to prevent depletion regions developed by the first and second barrier regions from extending into the active region.

17. A semiconductor diode laser according to claim 5 wherein the first cladding region extends widthwise across the diode structure over the top surfaces of the first and second barrier regions but does not extend into and fill the stripe channel in the substrate and a lightly doped semiconductor composition of the same conductivity type as the substrate and the first cladding region fills the laser stripe.

18. A semiconductor diode laser according to claim 15 wherein the first barrier layers in each of the first and second barrier regions and which contact the substrate top surface are comprised of p+-InP, the second barrier layers are comprised of p-InGaAsP, $\lambda_g=1.35$ um, the first cladding region is comprised of n-InP, the active region is InGaAsP, $\lambda_g=1.3$ um, the second cladding region is p-InP, the contact region is p+-InGaAsP, $\lambda_g=1.3$ um, and the lightly doped semiconductor composition filling the laser stripe channel is n-InP.

19. A semiconductor diode laser according to claim 5 wherein the active region consists essentially of a conventional planar single layer of active semiconductor lasing composition.

20. A semiconductor diode laser according to claim 5 wherein the active region consists essentially of an essentially planar layer of active semiconductor lasing composition having a large optical cavity formed therein.

21. A semiconductor diode laser according to claim 5 wherein the active region consists essentially of a multiple quantum well active region.

22. A semiconductor diode laser according to claim 5 wherein the active region consists essentially of a graded-index, separate-confinement heterostructure active region.

23. A semiconductor diode laser according to claim 15 wherein the active region consists essentially of a conventional planar single layer of active semiconductor lasing composition.

24. A semiconductor diode laser according to claim 15 wherein the active region consists essentially of an essentially planar layer of active semiconductor lasing composition having a large optical cavity formed therein.

25. A semiconductor diode laser according to claim 15 wherein the active region consists essentially of a multiple quantum well active region.

26. A semiconductor diode laser according to claim 15 wherein the active region consists essentially of a graded-index, separate-confinement heterostructure active region.

27. The method of operating a heterostructure combined semiconductor diode laser and junction field effect transistor device having a centrally located conduction path from a central exposed contact on its top surface through a centrally located semiconductor active laser region disposed between upper and lower opposite conductivity type cladding regions formed over a semiconductor substrate of the same conductivity type as the lower cladding region and having at least one laser stripe channel filled with a semiconductor composition of the same conductivity type as the lower cladding region and formed in the top surface of the substrate which supports the vertically arrayed cladding and active regions and an exposed contact on its underside, said semiconductor laser device including first and second semiconductor barrier regions of opposite conductivity type from the substrate interposed on opposite sides of the laser stripe channel between the lower cladding region and the substrate and electrically isolated one from the other, and first and second exposed contacts formed on the top surfaces of the respective first and second barrier regions;
said method being characterized in that independently controlled bias potentials are applied to the respective barrier regions via the first and second barrier layer contacts whereby depletion regions of independently controlled extent are established by the barrier regions in the laser stripe channel for controlling the magnitude of the current through the central conduction path to thereby modulate the intensity of a laser light beam produced in the active region.

28. The method of operating a semiconductor diode laser device according to claim 27 further comprising applying appropriate value and polarity bias potentials to the central and first and second exposed contacts relative to the bias potential applied to the substrate whereby current conduction through the central conduction path can be pinched off as well as modulated and the emission of laser light from the device can be terminated.

29. The method of operating a semiconductor diode laser device according to claim 27 further comprising applying appropriate polarity and relatively small value electrical bias potentials to the first and second exposed contacts whereby the central current conduction path through the device can be moved by variation of the relative extent of the depletion regions formed by the respective barrier regions and the physical position of the emitted light beam waist within the junction plane of the active region can be moved to thereby result in lateral movement in a desired direction of the emitted laser beam output light spot along the laser facet.

30. The method of operating a semiconductor diode laser device according to claim 28 further including applying appropriate polarity and relatively small value electrical bias potentials to the first and second exposed contacts whereby the central current conduction path through the device can be moved by variation of the relative extent of the depletion regions formed by the respective barrier regions and the physical position of the emitted light beam waist within the junction plane of the active region can be moved to thereby result in lateral movement in a desired direction of the emitted laser beam output light spot along the laser facet.

* * * * *